United States Patent [19]

Smith

[11] Patent Number: 4,977,106

[45] Date of Patent: Dec. 11, 1990

[54] TIN CHEMICAL VAPOR DEPOSITION USING TICL4 AND SIH4

[75] Inventor: Gregory C. Smith, Garland, Tex.

[73] Assignee: Texas Instruments Incorporated, Dallas, Tex.

[21] Appl. No.: 521,057

[22] Filed: May 1, 1990

[51] Int. Cl.$^5$ .......................................... H01L 21/443
[52] U.S. Cl. .................. 437/192; 427/255.2
[58] Field of Search ............................ 437/192, 245; 427/255.2

[56] References Cited

U.S. PATENT DOCUMENTS 4,469,801  9/1984  Hirai et al. ............................. 501/96
4,701,349  10/1987  Koyanagi et al. .................. 437/241
4,803,127  2/1989  Hakim ............................... 427/255.2

OTHER PUBLICATIONS

"Thermodynamic Investigation of Selective Tungsten Chemical Vapour Deposition: Influence of Growth Conditions and Gas Additives on the Selective in the Fluoride Process", Carlsson et al., Thin Solid Films, 158 (1988) 107–122.

*Primary Examiner*—Brian E. Hearn
*Assistant Examiner*—Trung Dang
*Attorney, Agent, or Firm*—Mel Sharp; James T. Comfort; Joy Griebenow

[57] ABSTRACT

A procedure in the formation of semiconductor devices for depositing TiN wherein silane and preferably SiH4 is substituted for the hydrogen in the prior art procedures to provide the approximate twofold to fivefold increase in TiN deposition rate at 400 degrees C. It is believed that the reason for the deposition rate increase is that there is a larger free energy change in the reaction which is believed to occur according to the equation: $TiCl_4 + SiH_4 + NH_3 \rightarrow TiN + SiCl_4 + (7/2)H_2$. The above described reaction provides cleaner films when performed in a cold wall CVD reactor than is provided by the prior art procedures as described above. Resistivity of 100 microohm-cm has been measured, this being typical of sputtered TiN films.

16 Claims, No Drawings

TIN CHEMICAL VAPOR DEPOSITION USING TICL4 AND SIH4

The U.S. Government has a paid-up license in this invention and the right in limited circumstances to require the patent owner to license others on reasonable terms as provided for by the terms of a contract with the United States Air Force under the program name MMST.

BACKGROUND OF THE INVENTION

1. Field of the Invention

This invention relates to the formation of titanium nitride electrical conductors in semiconductor devices and, more specifically, to the chemical vapor deposition of such titanium nitride conductors.

2. Brief Description of the Prior Art

Titanium nitride is an electrically conductive material which is generally used in semiconductor fabrication as a nucleating layer or for local interconnects. Titanium nitride films for use in the fabrication of semiconductor devices have generally been provided in the past in cold wall chemical vapor deposition (CVD) reactors by reacting titanium tetrachloride with ammonia and hydrogen according to the reaction: $2\ TiCl_4 + 2\ NH_3 + H_2 \rightarrow 2TiN + 8\ HCl$. TiN has also been produced with the hydrogen omitted. However, it has been necessary to operate at temperatures generally above 500 degrees C. and usually at even higher temperatures in order to obtain a high TiN deposition rate. The deposition rate is a critical factor, especially in a single wafer reactor. It is known that deposition temperatures above about 500 degrees C. and sometimes as low as 400 degrees C. will cause ultimate device degradation if, for example, the semiconductor device being fabricated already has aluminum thereon or if the transistors have already been formed in or on the substrate.

It is also known that a silicon film has been shown deposited in situ before and/or after the TiN for gate application as set forth in U.S. Pat. No. 4,570,328 of Price et al.

It is therefore apparent that a TiN deposition process which deposits TiN at a rate on the order presently obtained by prior art relatively high temperature procedures and which can be operated at temperatures of about 400 degrees C. and even lower is highly desirable and has been long sought by the art.

SUMMARY OF THE INVENTION

In accordance with the present invention, the above noted problem in the art is substantially minimized and there is provided a procedure for depositing TiN in accordance with the methods described above wherein the TiN deposition rate at 400 degrees C. is about two to about five times as great as is obtainable at the same temperature by the prior art techniques.

Briefly, in accordance with the present invention, a silane having from one to three silicon atoms and preferably silane ($SiH_4$) is substituted for or added to the hydrogen in the prior art procedures described above to provide the approximate twofold to fivefold increase in the TiN deposition rate at 400 degrees C. It is believed that the reason for the deposition rate increase is that there is a larger free energy change in the reaction which is believed to occur according to the equation: $TiCl_4 + SiH_4 + NH_3 \rightarrow TiN + SiCl_4 + (7/2)H_2$. The above described reaction provides cleaner films when performed in a cold wall CVD reactor than is provided by the prior art procedures as described above. Resistivity of 100 microohm-cm has been measured, this being typical of sputtered TiN films.

A TiN layer is formed in the process of fabrication of a semiconductor device in accordance with the present invention by placing the device under fabrication in, for example, a cold wall CVD reactor at a pressure of from about 0.1 to about 10 Torr and preferably 1 Torr at a temperature of from about 375 to about 500 degrees C. and preferably about 400 degrees C. and reacting in the chamber 5 to 100 SCCM $TiCl_4$ with about 200 to 500 SCCM each of $SiH_4$ and $NH_3$. A preferred amount of $TiCl_4$ is about 10 to about 20 SCCM. The device being fabricated is held in the chamber for a period determined by the deposition rate and the film thickness desired.

DESCRIPTION OF THE PREFERRED EMBODIMENT

A substrate of silicon was placed in a cold wall CVD reactor. The reactor was then evacuated to a pressure of 1 Torr and a stream of $TiCl_4$ at 10 SCCM, a stream of $NH_3$ at 300 SCCM and a stream of $SiH_4$ at 300 SCCM were each concurrently passed into the chamber at a temperature of 400 degrees C. for 10 minutes. The substrate was then cooled and removed from the chamber and the resistivity of the film was measured and found to be 100 microohm-cm. The thickness of the film deposited was found to be 10,000 Angstroms.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of forming a titanium nitride layer in the fabrication of a semiconductor device, comprising the steps of:
    (a) providing a semiconductor device under fabrication;
    (b) placing said device in a vacuum of from about 0.1 to about 10 Torr;
    (c) adjusting the temperature of said device in said chamber to from about 375 to about 500 degrees C.;
    (d) applying a stream of each of from about 5 to about 100 SCCM $TiCl_4$, from about 200 to about 500 SCCM $NH_3$ and from about 200 to about 500 SCCM of a silane having from 1 to 3 silicon atoms in said chamber for a predetermined time to form a layer of TiN over the surface of said device.

2. The method of claim 1 wherein said silane is $SiH_4$.

3. The method of claim 1 wherein said temperature is about 400 degrees C.

4. The method of claim 2 wherein said temperature is about 400 degrees C.

5. The method of claim 1 wherein said pressure is about 1 Torr.

6. The method of claim 2 wherein said pressure is about 1 Torr.

7. The method of claim 3 wherein said pressure is about 1 Torr.

8. The method of claim 4 wherein said pressure is about 1 Torr.

9. The method of claim 1 wherein said stream of $TiCl_4$ is about 10 SCCM, said stream of $NH_3$ is about 300 SCCM and said stream of silane is about 300 SCCM.

10. The method of claim 3 wherein said stream of TiCl4 is about 10 SCCM, said stream of NH3 is about 300 SCCM and said stream of silane is about 300 SCCM.

11. The method of claim 5 wherein said stream of TiCl4 is about 10 SCCM, said stream of NH3 is about 300 SCCM and said stream of silane is about 300 SCCM.

12. The method of claim 7 wherein said stream of TiCl4 is about 10 SCCM, said stream of NH3 is about 300 SCCM and said stream of silane is about 300 SCCM.

13. The method of claim 2 wherein said stream of TiCl4 is about 10 SCCM, said stream of NH3 is about 300 SCCM and said stream of silane is about 300 SCCM.

14. The method of claim 4 wherein said stream of TiCl4 is about 10 SCCM, said stream of NH3 is about 300 SCCM and said stream of silane is about 300 SCCM.

15. The method of claim 6 wherein said stream of TiCl4 is about 10 SCCM, said stream of NH3 is about 300 SCCM and said stream of silane is about 300 SCCM.

16. The method of claim 8 wherein said stream of TiCl4 is about 10 SCCM, said stream of NH3 is about 300 SCCM and said stream of silane is about 300 SCCM.

* * * * *